(12) United States Patent
Lu et al.

(10) Patent No.: US 8,999,610 B2
(45) Date of Patent: Apr. 7, 2015

(54) LITHOGRAPHY MASK REPAIRING PROCESS

(71) Applicant: Taiwan Semiconductor Manufacturing Company, Ltd., Hsin-Chu (TW)

(72) Inventors: Chien-Hsing Lu, Tainan (TW);
Chung-Hung Lin, Tainan (TW);
Chih-Wei Wen, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 13/731,420

(22) Filed: Dec. 31, 2012

(65) Prior Publication Data

US 2014/0186750 A1  Jul. 3, 2014

(51) Int. Cl.
*G03F 1/74* (2012.01)
(52) U.S. Cl.
CPC ............... *G03F 1/74* (2013.01); *Y10S 430/143* (2013.01)
(58) Field of Classification Search
CPC ......................................................... G03F 1/74
USPC .............................. 430/5, 296, 323, 324, 942
See application file for complete search history.

(56) References Cited

U.S. PATENT DOCUMENTS

| | | | |
|---|---|---|---|
| 5,807,650 A * | 9/1998 | Komano et al. ................... 430/5 |
| 2006/0093925 A1 | 5/2006 | Cheng |
| 2006/0147814 A1 | 7/2006 | Liang |
| 2012/0328974 A1 | 12/2012 | Takaoka |
| 2014/0255826 A1 * | 9/2014 | Chen et al. ....................... 430/5 |

FOREIGN PATENT DOCUMENTS

| | | |
|---|---|---|
| TW | I263262 | 10/2006 |
| TW | I286273 | 9/2007 |

OTHER PUBLICATIONS

Kono, M., et al., "Photodissociative excitation processes of $XeF_2$ in the vacumm ultraviolet region 105-180 nm," J Chem. Phys. vol. 102, No. 15, Apr. 15, 1995, pp. 5966-5978.

* cited by examiner

*Primary Examiner* — Christopher Young
(74) *Attorney, Agent, or Firm* — Slater & Matsil, L.L.P.

(57) ABSTRACT

A method includes performing a beam scan on a photolithography mask to repair the photolithography mask. After the beam scan, a radiation treatment is performed on the photolithography mask. The method is performed by an apparatus including a beam generator configured to generate and project a beam on the lithography mask, a radiation source configured to generate a radiation on the lithography mask, and a process gas source configured to release a process gas onto the lithography mask. The process as reacts with a surface portion of the lithography mask to repair the lithography mask. With the radiation treatment, residue process gas on the lithography mask is removed.

21 Claims, 10 Drawing Sheets

LITHOGRAPHY MASK REPAIRING PROCESS

BACKGROUND

Lithography (also known as photolithography) is a commonly used technique in the integrated circuit manufacturing process. In a lithography process, a material layer that is to be patterned is formed first. A photo resist is applied on the material layer. The photo resist is exposed to light through a lithography mask, which includes transparent patterns that allow the light to pass through, and opaque patterns that block the light. The exposed photo resist is developed to form a patterned photo resist. In the patterned photo resist, depending on whether the photo resist is negative or positive, either the portions that were exposed to the light are removed, or the portions that were not exposed to the light are removed. The material is then etched, wherein the portions of the material layer protected by the remaining portions of the photo resist remain, and the un-protected portions of the material layer are removed.

The lithography mask is made prior to the lithography process. The lithography mask is formed by forming an opaque layer over a transparent layer, and then patterning the opaque layer. The regions where the opaque layer is left un-removed are the opaque portions of the resulting lithography mask, and the regions where the opaque layer is removed are the transparent portions of the resulting lithography mask.

In the patterning of the lithography mask, however, defects may occur. For example, some portions of the opaque layer intended to be removed may actually be left un-removed. These portions need to be removed in a repair process. In the repair process, an electron beam or an ion beam may be used to scan and remove the defective portions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A repair process of a photolithography mask (also referred to as a lithography mask hereinafter) and the apparatus for performing the same are provided in accordance with various exemplary embodiments. The intermediate stages of the repair process are illustrated. The variations of the embodiments are discussed. Throughout the various views and illustrative embodiments, like reference numbers are used to designate like elements.

Figure 1:
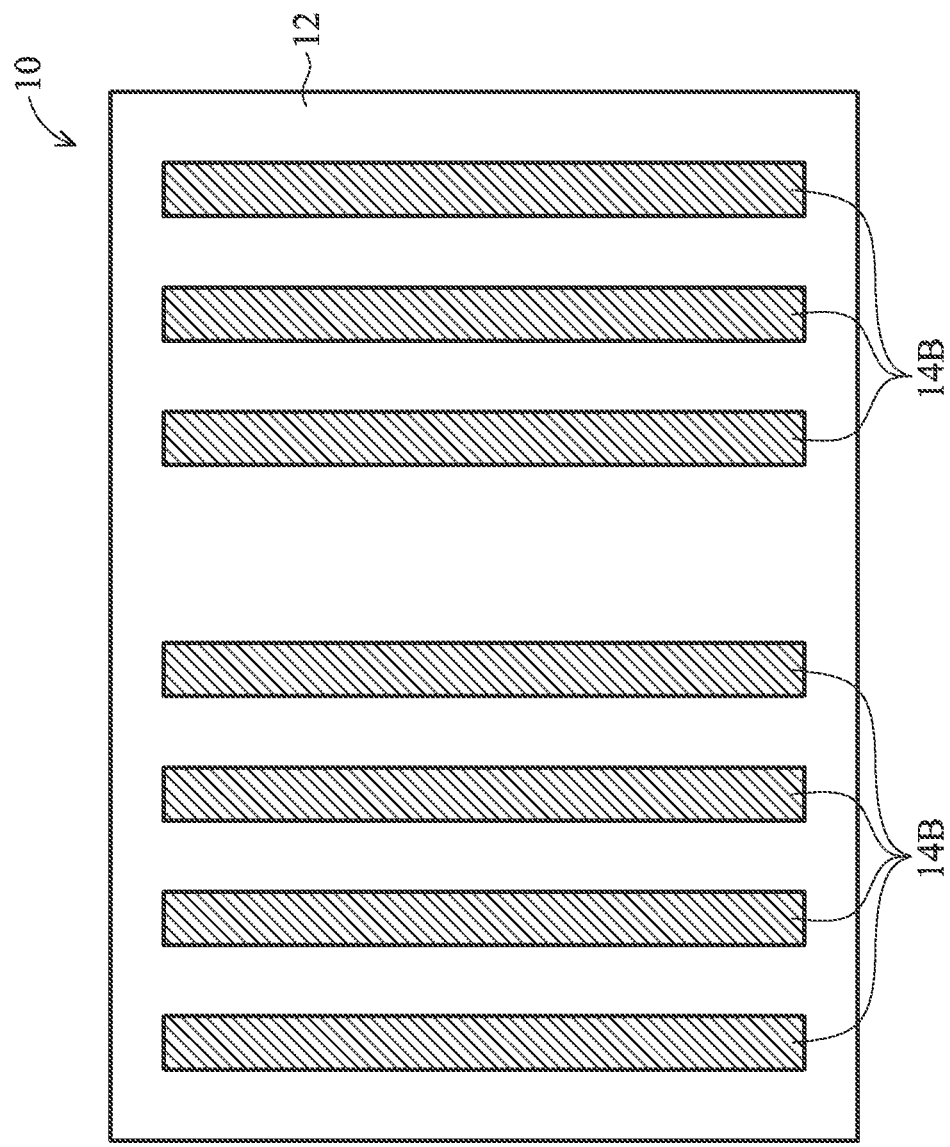
FIG. 1 illustrates a top view of a portion of an exemplary lithography mask in accordance with exemplary embodiments.

FIG. 1 illustrates a top view of exemplary lithography mask 10 in accordance with some embodiments. Lithography mask 10 may be a Binary Intensity Mask (BIM) in accordance with some embodiments. Lithography mask 10 includes transparent substrate 12, and opaque patterns 14B on transparent substrate 12. Substrate 12 may be a glass substrate, a quartz substrate, or the like, which allows the light that is used in lithography processes to penetrate through. Opaque patterns 14B are formed of an opaque layer that will block the light used in the lithography processes. In some exemplary embodiments, the light used the lithography processes may be a visible light (such as yellow light), violet light, ultra-violet light, or lights having higher frequencies than the visible light. Although FIG. 1 illustrates some simple patterns such as strips, the layout of the opaque patterns 14B may be more complicated.

Figure 2:
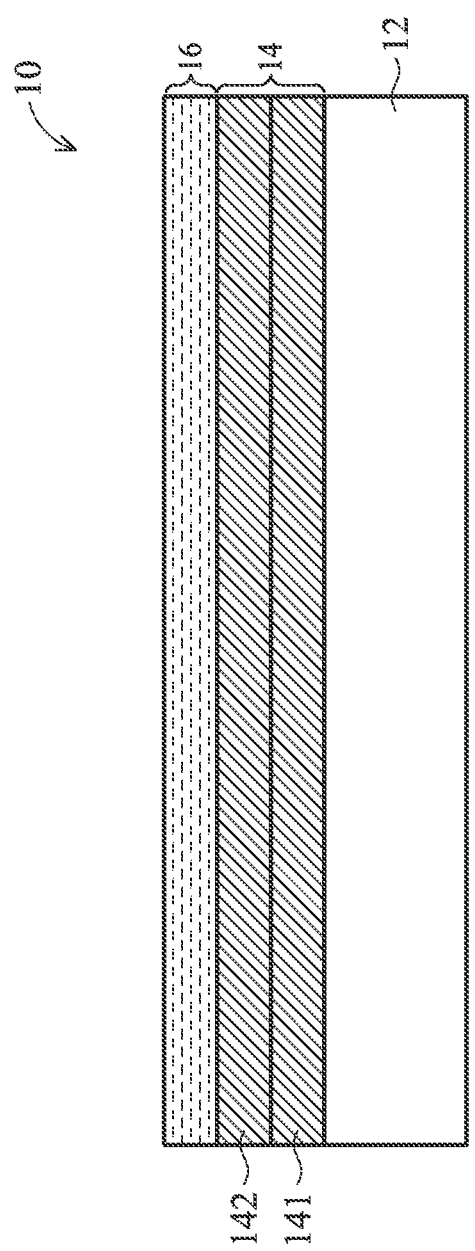
FIGS. 2 through 4B are cross-sectional views and top views of a lithography mask in accordance with some exemplary embodiments, wherein the cross-sectional views and top views are obtained from intermediate stages in the repairing of the lithography mask.

FIGS. 2 through 4B illustrate cross-sectional views and top views of some intermediate stages in the manufacturing of the intended lithography mask 10 in FIG. 1. Referring to FIG. 2, substrate 12 is provided, which is formed of a transparent material. Opaque layer 14 is formed over substrate 12 as a blanket layer. Substrate 12 and opaque layer 14 in combination form blanket mask 10. In some embodiments, opaque layer 14 is a single layer. In alternative embodiments, opaque layer 14 is a composite layer comprising a plurality of layers. For example, opaque layer 14 may be a single layer that comprises homogenous Molybdenum Silicide (MoSi). In alternative embodiments, opaque layer 14 comprises sub-layer 14-1, and sub layer 14-2 over subs-layer 14-1, wherein sub layer 14-2 may be used as an anti-reflective layer. Sub layers 14-1 and 14-2 may both comprise MoSi, with slightly different compositions. In yet other embodiments, opaque layer 14 comprises more than two layers. In some embodiments, over opaque layer 14 resides mask layer 16, which may comprise chromium, although other materials may be used.

Figure 3A:
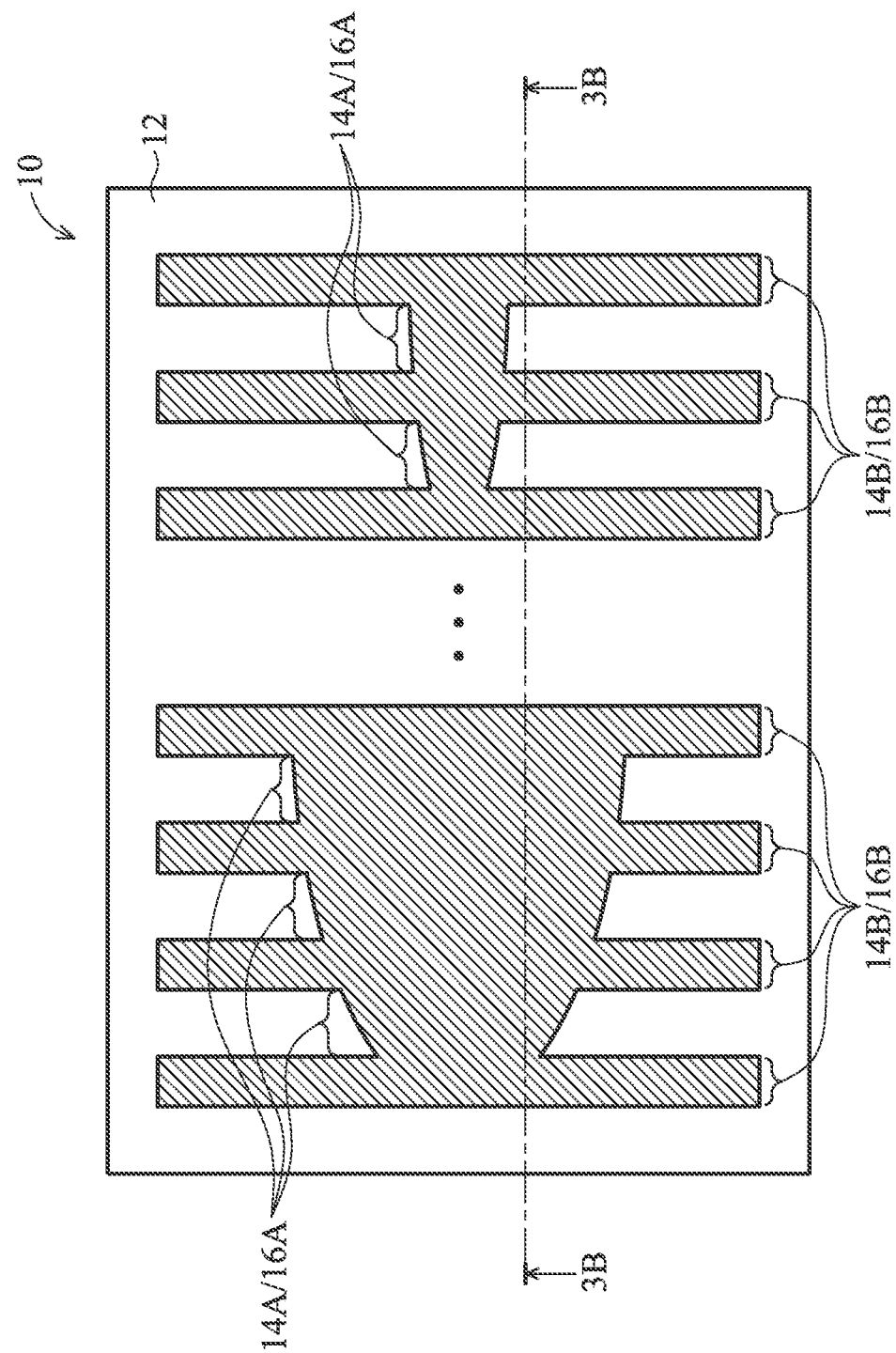
Figure 3B:
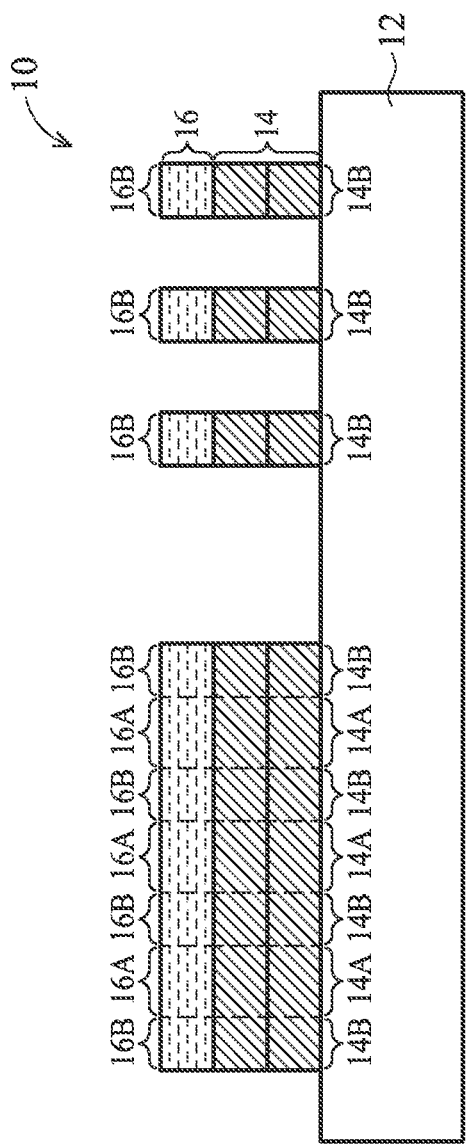

Referring to FIGS. 3A and 3B, which are a top view and a cross-sectional view, respectively, of the patterning of the structure in FIG. 2. Referring to FIG. 3A, a patterning step is performed to remove undesirable portions of opaque layer 14 and mask layer 16. The patterning may include electron beam writing, ion beam writing, laser etching, or the like. After the patterning step, opaque patterns 14B and the overlying portions 16B of mask layer 16 remain. Furthermore, defects 14A may be generated undesirably, which defects 14A include opaque portions that should be removed, but undesirably remain. In addition, portions 16A of mask layer 16, which overlap opaque portions 14A, may be left un-removed, although they may also be removed partially or entirely.

FIG. 3B illustrates a cross-sectional view of the structure in FIG. 3A, wherein the cross-sectional view is obtained from the plane crossing line 3B-3B in FIG. 3A. As shown in FIG. 3B, portions of mask layer 16 and opaque layer 14 are removed, and the underlying portions of transparent substrate 12 are exposed. Opaque portions 14A cover the portions of transparent substrate 12 that are intended to be exposed, and hence are defects.

Figure 4A:
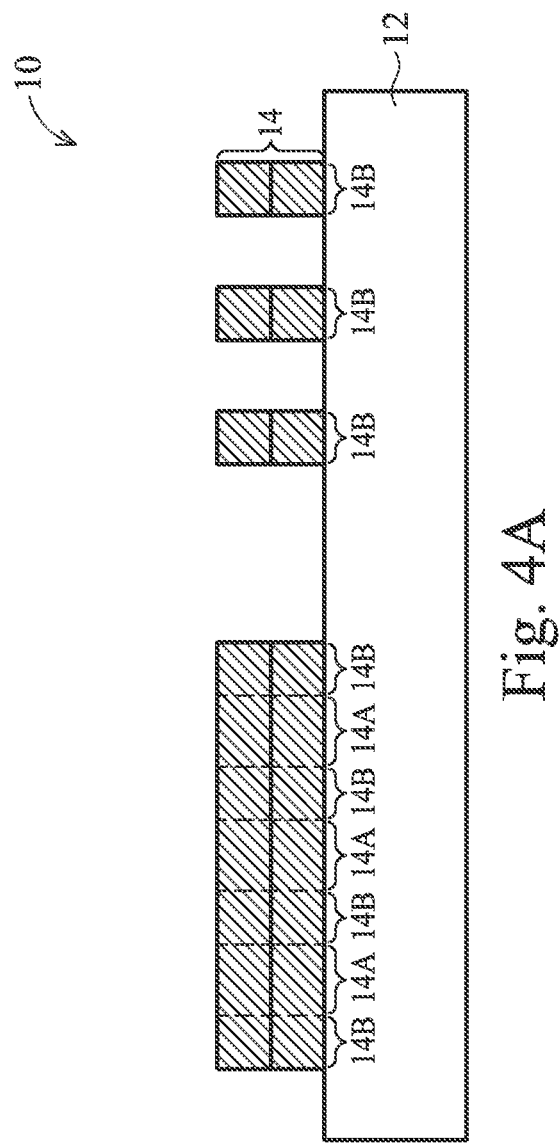
Figure 4B:
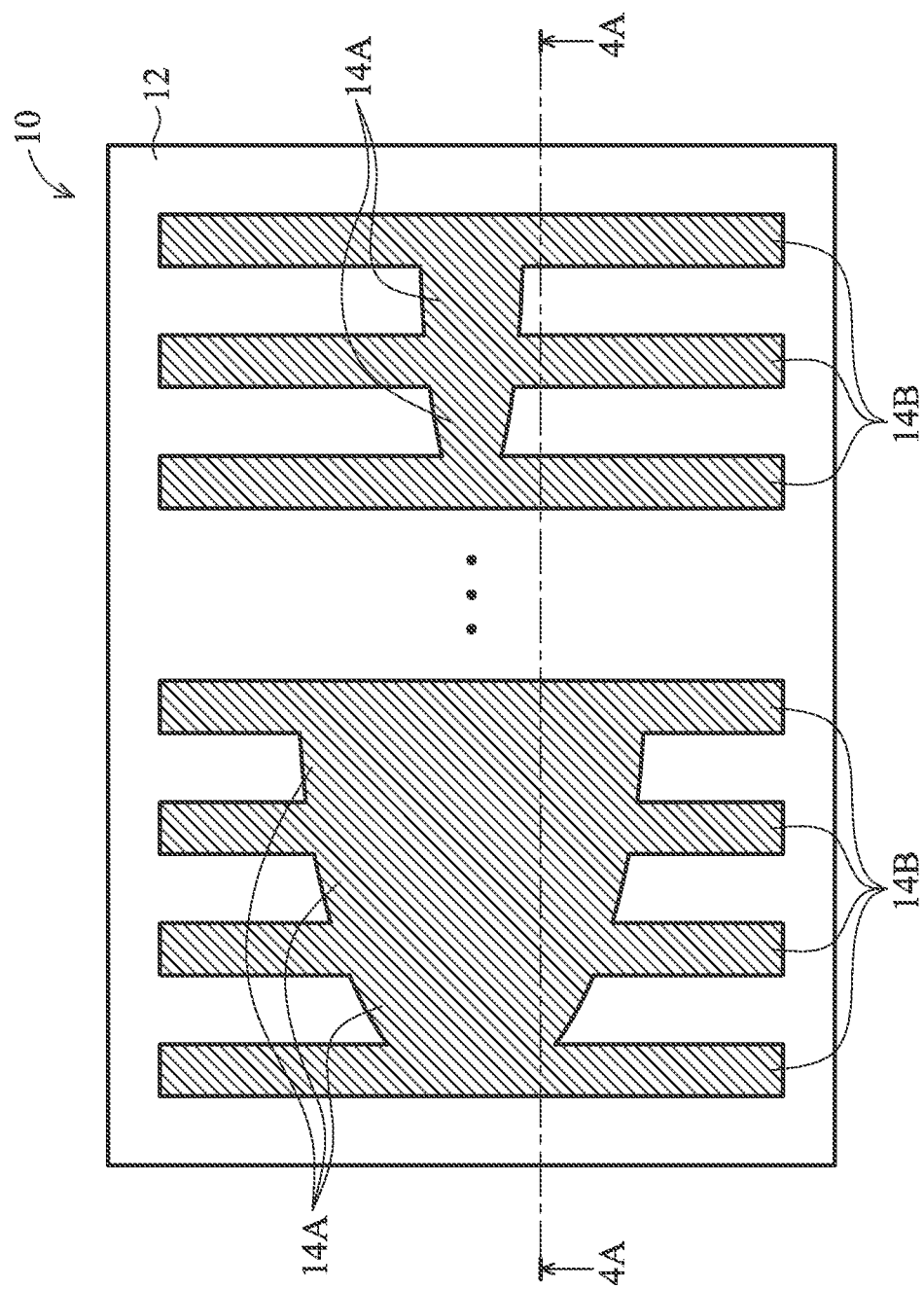

Next, mask layer 16 (including portions 16A and 16B) is removed. The resulting structure is shown in FIGS. 4A and 4B, which are a cross-sectional view and a top view, respectively. FIG. 4A is obtained from the plane crossing line 4A-4A in FIG. 4B. As shown in FIG. 4B, defects 14A remain as parts of lithography mask 10. The resulting lithography mask 10 is then reviewed to find defects 14A, which are then recorded for the subsequent repair process.

Figure 5:
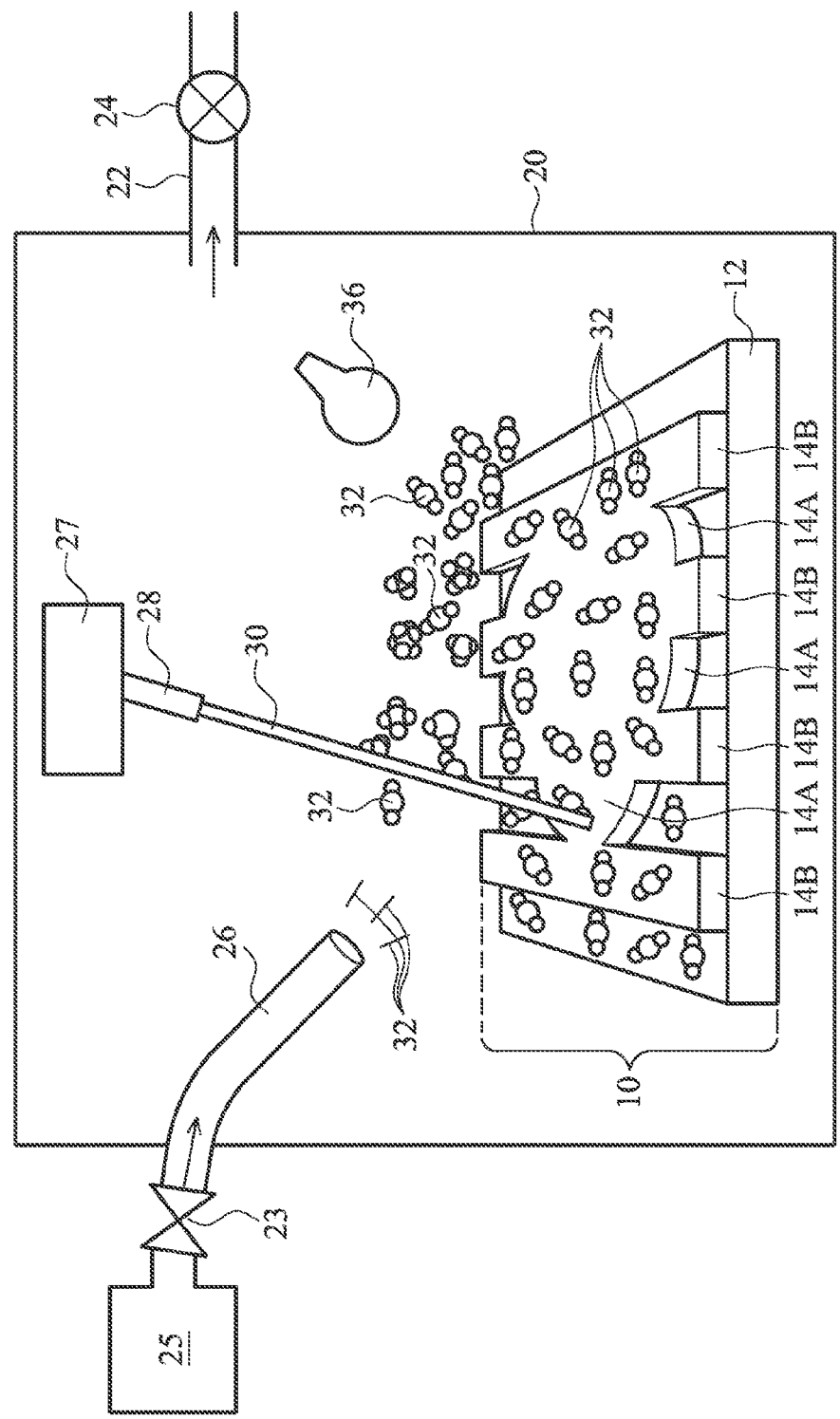
FIGS. 5 through 8 illustrate intermediate stages in the repairing of the lithography mask in accordance with some exemplary embodiments.

Referring to FIG. 5, lithography mask 10 is placed into process chamber 20, which is configured to repair lithography mask 10. In accordance with some embodiments, process chamber 20 is configured to vacuum, for example, through outlet 22. Pump 24 may be used for the vacuuming. Inlet 26 is configured to inject process gases into chamber 20. Furthermore, beam scanner 27 is provided, wherein head 28 of beam scanner 27 is disposed in process chamber 20. The controlling parts of beam scanner 27 may be located inside or outside process chamber 20. Beam scanner 27 may generate beam 30, which may be an electron beam or an ion beam (such as the beam of $Ga^+$ ions). Beam scanner 27 is also configured to scan designated portions of lithography mask 10, which designated portions may include, for example defect portions 14A in FIGS. 4A and 4B. In the scanning process, the portions of lithography mask 10 that are not defects, such as portions 14B (FIGS. 4A and 4B), are not scanned by beam 30.

During the repairing of lithography mask 10, process gas 32 is introduced into process chamber 20 through inlet 26. Inlet 26 is connected to process gas source 25, which may be a gas tank for storing process gas 32. In some embodiments, valve 23 is connected between inlet 26 and process gas source 25. Valve 23 may be used to turn on and off the flow of the process gas 32, and/or control the flow rate of process gas 32. In some embodiments, the process gas includes Xeon difluoride ($XeF_2$), which reacts with opaque layer 14 (MoSi in some examples), which reaction is induced and/or accelerated by the electron/ion beam 30. The partial pressure of process gas 32 may be, for example, between about 1.5E-3 mtorr and about 1.5E-2 mtorr, although different partial pressures may be used. The following reaction may occur:

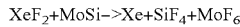

$$XeF_2 + MoSi \rightarrow Xe + SiF_4 + MoF_6$$

wherein Xe, $SiF_4$, and $MoF_6$ (in a gaseous form) may then be removed from process chamber 20. By controlling which portions of lithography mask 10 are scanned by beam, the un-needed portions 14A may be removed, and portions 14B may remain.

During the scan process, the $XeF_2$ molecules may accumulate on the surface of opaque layer 14, and react with opaque layer 14. As a result, the $XeF_2$ molecules accumulated on opaque portions 14B also react with opaque portions 14B. This may cause the loss of opaque portions 14B. Although opaque portions 14B are not exposed directly to electron/ion beam 30, and the reaction rate is lower than portions 14A that are scanned by electron/ion beam 30, mask loss may still occur, and the thickness of opaque portions 14B is reduced. Opaque portions 14B are intended to remain in the final lithography mask 10. The loss of opaque portions 14B thus affects the quality of lithography mask 10.

Figure 6:
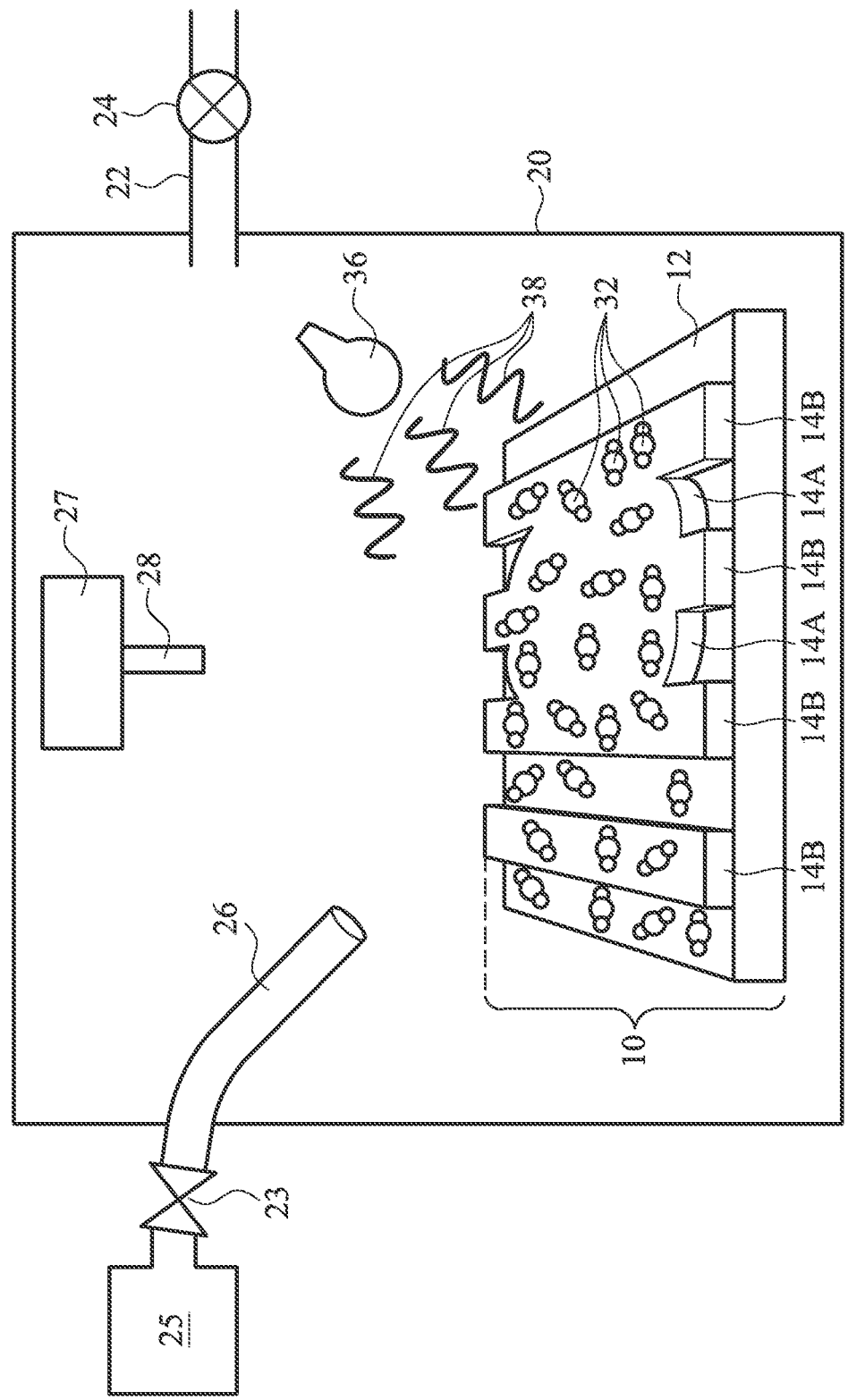

After a period of beam scan, a radiation treatment may be performed, as shown in FIG. 6. In some embodiments, the radiation treatment is performed after all defects in lithography mask 10 have gone through a repair process (and scanned by electron/ion beam 30), and it is reasonably expected that the repair is finished. In alternative embodiments, the radiation treatment is performed after a part, but not all, of defects 14A in lithography mask 10 have been repaired. For example, as shown in FIG. 6, portions of undesirable opaque portions 14A are removed, while other undesirable opaque portions 14A have not been repaired yet. In yet other embodiments, the radiation treatment may be performed after the repair time has reached a preselected limit, wherein the pre-selected repair time may be between about 30 seconds and about 10 minutes. When this pre-selected limit of time is reached, the repair process is paused for the radiation treatment, and will be resumed after the radiation treatment.

Referring to FIG. 6, during the radiation treatment, the inflow of process gas (such as $XeF_2$) into process chamber 20 is stopped. The scanning of lithography mask 10 is also stopped, and there may be no electron/ion beam generated. Radiation source 36 is triggered to generate radiation 38, which may be a ultra-violet light, an extreme ultra-violet light, or other radiations that have higher frequencies than the ultra-violet band. Radiation 38 is projected on lithography mask 10 and the accumulated molecules (also denoted as 32) of process gas 32 on lithography mask 10. The frequency of radiation 38 is related to the composition of process gas 32, and the energy provided by radiation 38 is greater than the energy needed for dissociating process gas 32. For example, when process gas 32 comprises $XeF_2$, the bond energy of Xe—F is 1.13 eV, which is equal to 132 kJ/mol. Accordingly, the photons (or other elements) of radiation 38 need to have a quantum energy greater than 1.13 eV in order to break the Xe—F bonds, which bond-breaking is referred to as the dissociation of process gas 32. Radiation 38 thus has a maximum wavelength of 1097 nm, which corresponds to 1.13 eV, in these examples. Any light with a wavelength shorter than 1097 nm may be used to break the Xe-F bond. In some exemplary embodiments, a ultra-violet light with a wavelength of 172 nm may be used. As a result of the breaking of Xe—F bond, $XeF_2$ is broken into Xe gas and $F_2$ gas. Both Xe gas and $F_2$ gas can be evacuated out of process chamber 20. Xe gas is heavy, and may also be left on opaque layer 14. However, since Xe gas is an inert gas, it will not react with opaque layer 14, and will not cause the loss of MoSi.

In some exemplary embodiments, the radiation treatment has a duration between about 10 seconds and 30 minutes, although the radiation treatment may be longer or shorter, depending on the efficiency in the dissociation of process gas 32. After the radiation treatment, substantially all of the accumulated molecules 32 are dissociated. The radiation treatment may be performed without introducing any gas into process chamber 20, although some inert gases that do not react with lithography mask 10 may be introduced. After the radiation treatment, since the accumulated process gas is disassociated, the undesirable reaction between the accumulated process gas molecules and opaque layer portions 14B is prevented, or at least reduced.

After the radiation treatment, if the repair process has not been finished yet, the repair may be resumed to continue the scanning and the removal of the leftover portions 14A. The resumed repair process may be performed using essentially the same process as in FIG. 5, except that electron/ion beam 30 is projected on the remaining portions 14A that have not been scanned yet. In these embodiments, since the radiation treatment is performed in a vacuumed environment, there is no vacuum break between the initial repair processes and the resumed repair process. Accordingly, lithography mask 10 does not suffer from the pressure change resulted from the vacuum break and the subsequent vacuuming that otherwise would occur if the radiation treatment is performed in another environment. The likely particle peeling caused to lithography mask 10, which particle peeling is due to the vacuum change, is thus reduced.

Figure 7:
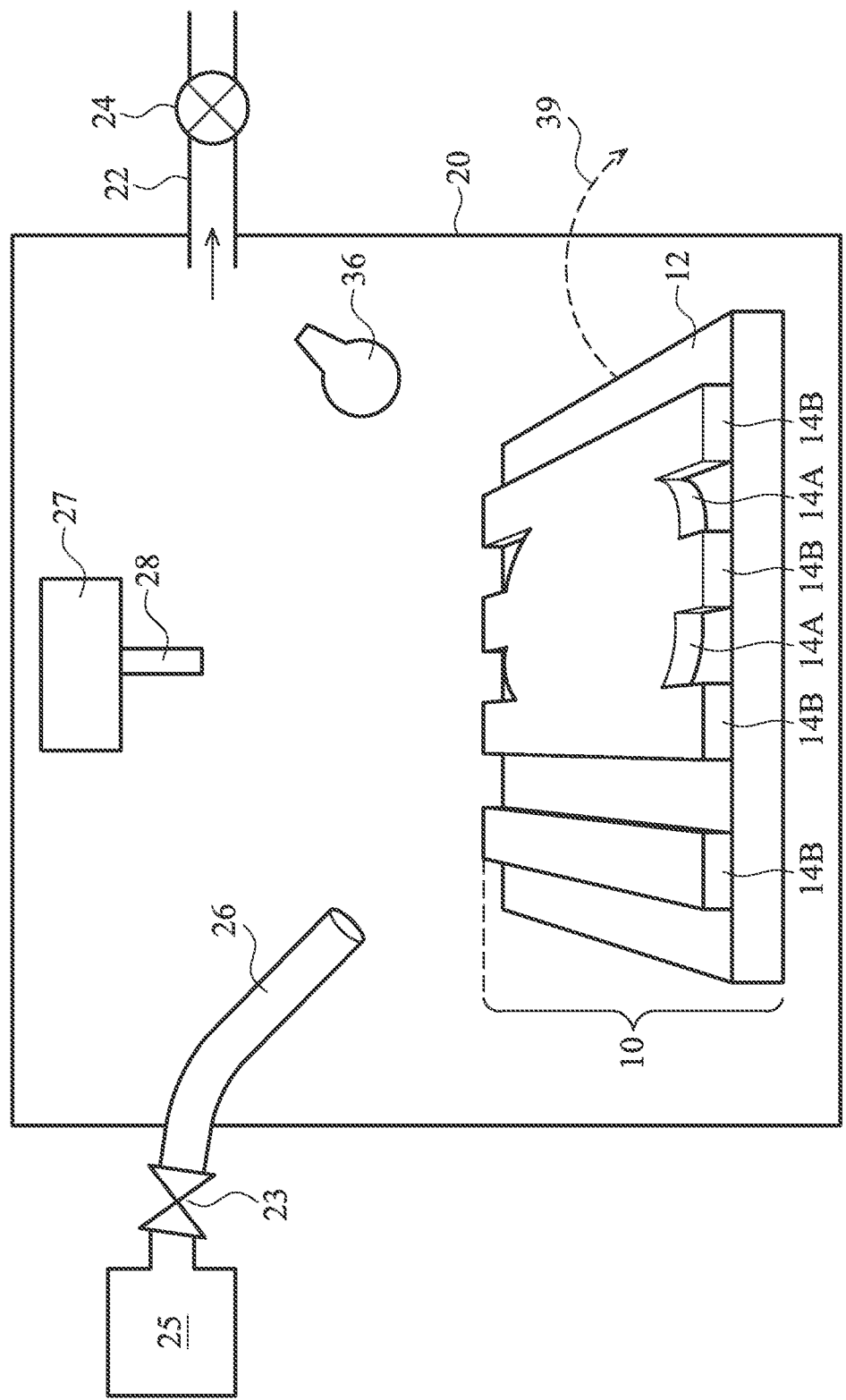
Figure 8:
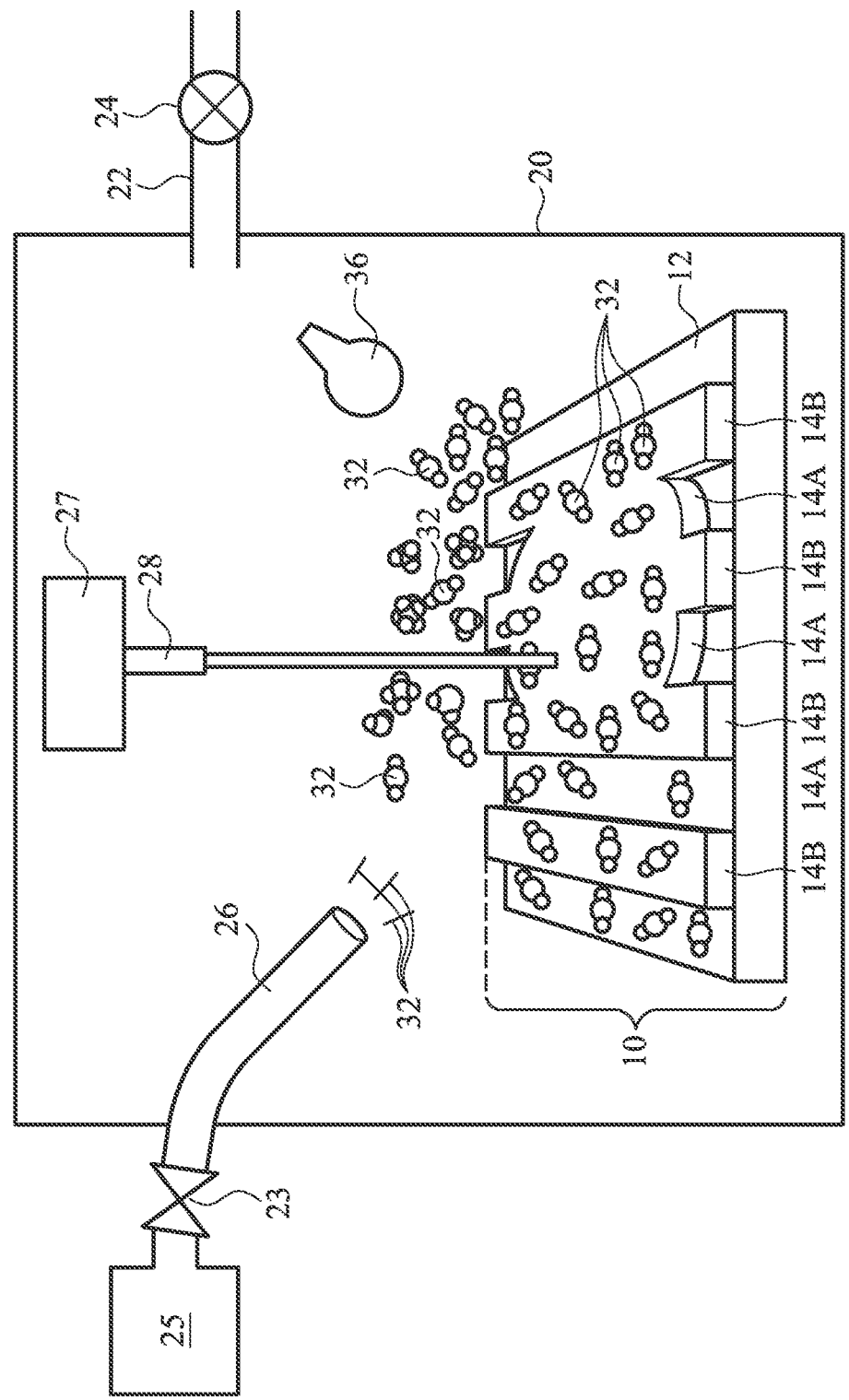

If, however, the repair process has been finished, the vacuum of process chamber 20 may be broken, and lithography mask 10 may be removed from process chamber 20 for inspection. The respective step is shown in FIG. 7, with arrow 39 indicate the removal of lithography mask 10 from process chamber 20. During the inspection, lithography mask 10 is reviewed to determine whether all defects 14A have been successfully repaired or not. If all defects 14A have been repaired, the repair process can be concluded. Otherwise, if some of the defects 14A have not been repaired successfully, then lithography mask 10 is sent back to process chamber 20, so that the remaining defects are repaired. The repair process is shown in FIG. 8. The details of the repair process in FIG. 8 may be essentially the same as in FIG. 5. After the repair, an additional radiation treatment similar to what is shown in FIG. 6 is performed. The process as shown in FIGS. 5 through 8 may be repeated until all the defects are repaired. After all the defects are removed, lithography mask 10 will have the intended patterns, as schematically illustrated in FIG. 1.

In some embodiments, the repair and the radiation treatment shown in FIGS. 5 through 8 are performed in-situ in process chamber 20, with no vacuum break therebetween. In alternative embodiments, the radiation treatment may be performed in a radiation chamber or environment separate from process chamber 20, which radiation chamber may be vacuumed or not vacuumed. In these embodiments, the radiation treatment may be performed in open air, or in an environment filled in with an inert gas. The radiation treatment may be performed using essentially the same radiation source 36 as in FIG. 6. After the radiation treatment, lithography mask 10 may be sent back to vacuum process chamber 20 for the continued repair if the repair has not been finished. If all of defects 14A (FIGS. 4A and 4B) have been scanned already, lithography mask 10 is inspected to decide whether the first repair is successful or not. If all defects have been successfully repaired, then the repair process can be concluded. Otherwise, if some of the defects 14A have not been repaired successfully, then lithography mask 10 is sent back to process chamber 20, so that the remaining defects 14A are repaired. After the repair, an additional radiation treatment similar to what is shown in FIG. 6 is performed.

During the repair process, since the accumulated molecules of the process gas used in the repair increase in amount when the repair proceeds, the loss in opaque portions 14B (FIG. 4A) becomes increasingly more severe with the increase in the repair time. Accordingly, by disassociate the accumulated molecules through the radiation treatment, the loss is at least reduced. This is particularly useful when there are a significant number of defects, and the repair process is lengthy. Since the otherwise lengthy repair process may be paused periodically to remove the accumulated molecules of the process gas, the loss is reduced.

In accordance with some embodiments, a method includes performing a beam scan on a photolithography mask to repair the lithography mask. After the beam scan, a radiation treatment is performed on the photolithography mask.

In accordance with other embodiments, a method includes performing a beam scan on a photolithography mask to repair the lithography mask. The beam scan includes introducing a process gas into a process chamber, with the lithography mask located in the process chamber. The process gas is configured to react with a portion of the lithography mask. The beam scan further includes projecting a beam on undesirable portions of the lithography mask to remove undesirable portions of the lithography mask. After the beam scan, a radiation treatment is performed on the photolithography mask using a radiation, wherein the radiation has a quantum energy greater than a bond energy between atoms of molecules of the process gas.

In accordance with yet other embodiments, an apparatus includes a beam generator configured to generate and project a beam on a lithography mask, a radiation source configured to generate a radiation on the lithography mask, and a process gas source configured to release a process gas onto the lithography mask.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   performing a first beam scan on a photolithography mask to repair the photolithography mask; and
   after the first beam scan, performing a first radiation treatment on the photolithography mask.

2. The method of claim 1, wherein the first beam scan is performed using a process gas having a bond energy, and wherein the first radiation treatment is performed using a light having a quantum energy greater than the bond energy.

3. The method of claim 2, wherein the process gas comprises Xeon Di-fluoride ($XeF_2$), and wherein the first radiation treatment is performed using a ultra violet light.

4. The method of claim 1, wherein the first beam scan and the first radiation treatment are performed in a process chamber, and wherein between the first beam scan and the first radiation treatment, the process chamber remains vacuumed.

5. The method of claim 4, wherein during the first radiation treatment, a process gas used in the first beam scan to react with the photolithography mask is stopped from being introduced into the process chamber.

6. The method of claim 1 further comprising:
   after the first radiation treatment, performing a second beam scan on the photolithography mask to further repair the photolithography mask; and
   after the second beam scan, performing a second radiation treatment on the photolithography mask, wherein in the second beam scan, portions of defects un-removed by the first beam scan are removed.

7. The method of claim 6, wherein the first radiation treatment and the second beam scan are preformed in a same process chamber, with no vacuum break therebetween.

8. The method of claim 1 further comprising, after the first beam scan and before the first radiation treatment, removing the photolithography mask from a vacuum chamber in which the first beam scan is performed.

9. A method comprising:
   performing a first beam scan on a photolithography mask to repair the photolithography mask, wherein the first beam scan comprises:
      introducing a process gas into a process chamber, with the photolithography mask located in the process chamber, wherein the process gas is configured to react with a portion of the photolithography mask; and projecting a beam on undesirable portions of the photolithography mask to remove undesirable portions of the photolithography mask; and after the first beam scan, performing a first radiation treatment on the photolithography mask using a radiation, wherein the radiation has a quantum energy greater than a bond energy between atoms of molecules of the process gas.

10. The method of claim 9, wherein the undesirable portions of the photolithography mask comprises Molybdenum Silicide (MoSi), and wherein the process gas comprises Xeon Di-fluoride ($XeF_2$).

11. The method of claim 9, wherein the beam comprises an electron beam.

12. The method of claim 9, wherein the beam comprises an ion beam.

13. The method of claim 9, wherein between the first beam scan and the first radiation treatment, the process chamber remains vacuumed.

14. The method of claim 13, wherein during the first radiation treatment, the process gas is stopped from being introduced into the process chamber.

15. The method of claim 9 further comprising:
after the first radiation treatment, performing a second beam scan on the photolithography mask, wherein the first radiation treatment and the second beam scan are in-situ performed in the process chamber; and
after the second beam scan, performing a second radiation treatment on the photolithography mask in the process chamber.

16. A method comprising:
performing a radiation treatment on a photolithography mask to break bonds in molecules of a process gas attached to the photolithography mask, wherein the photolithography mask is configured to be used in a photolithography process.

17. The method of claim 16, wherein the photolithography mask comprises Molybdenum Silicide (MoSi), and the process gas comprises Xeon Di-fluoride ($XeF_2$).

18. The method of claim 17, wherein the process gas is broken into Xe gas and $F_2$ gas, and the method further comprises evacuating the Xe gas and the $F_2$ gas from a process chamber holding the photolithography mask.

19. The method of claim 16, wherein the radiation treatment is a blanket treatment performed on the photolithography mask.

20. The method of claim 16, wherein at a time the radiation treatment is performed, the process gas is stopped from being introduced into a process chamber for holding the photolithography mask.

21. The method of claim 16 further comprising:
before the radiation treatment, introducing the process gas into a process chamber, with the photolithography mask placed in the process chamber; and
projecting a light beam on a portion of the photolithography mask to activate the process gas to react with the portion of the photolithography mask.

* * * * *